United States Patent
Buller et al.

(10) Patent No.: US 6,245,649 B1
(45) Date of Patent: Jun. 12, 2001

(54) METHOD FOR FORMING A RETROGRADE IMPURITY PROFILE

(75) Inventors: James F. Buller, Austin; Jon D. Cheek, Round Rock; Daniel Kadosh, Austin; Derick J. Wristers, Austin; H. Jim Fulford, Austin, all of TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/251,923

(22) Filed: Feb. 17, 1999

(51) Int. Cl.$^7$ .................... H01L 21/04; H01L 21/425
(52) U.S. Cl. .................... 438/514; 438/510; 438/526
(58) Field of Search ........................ 438/514, 510, 438/277, 527, 526

(56) References Cited

U.S. PATENT DOCUMENTS

| | | | |
|---|---|---|---|
| 4,463,493 | 8/1984 | Momose | 29/576 B |
| 4,578,128 | 3/1986 | Mundt et al. | 148/191 |
| 4,965,648 | 10/1990 | Yang et al. | 357/24 |
| 5,079,177 | 1/1992 | Lage et al. | 437/31 |
| 5,264,394 | 11/1993 | Ruckman et al. | 437/225 |
| 5,266,510 | 11/1993 | Lee | 437/44 |
| 5,292,671 | 3/1994 | Odanaka | 437/29 |
| 5,349,225 | * 9/1994 | Redwine | 257/336 |
| 5,409,848 | 4/1995 | Han et al. | 437/35 |
| 5,547,882 | 8/1996 | Juang et al. | 437/40 |
| 5,565,377 | 10/1996 | Weiner et al. | 437/173 |
| 5,637,512 | 6/1997 | Miyasaka et al. | 438/166 |
| 5,656,844 | 8/1997 | Klein et al. | 257/347 |
| 5,770,485 | 6/1998 | Gardner et al. | 438/162 |
| 5,827,763 | 10/1998 | Gardner et al. | 438/232 |
| 5,837,597 | * 11/1998 | Saito | 438/528 |
| 5,864,163 | 1/1999 | Chou et al. | 257/385 |
| 5,866,458 | * 2/1999 | Lee | 438/277 |
| 5,989,963 | * 11/1999 | Luning et al. | 438/289 |

OTHER PUBLICATIONS

Shahidi et al., "Indium Channel Implant for Improved Short–Channel Behavior of Submicrometer MOSFETs," *IEEE Electron Device Letters*, 14(8):409–11, 1993.

Bouillon et al., "Re–examination of Indium implantation for a low power 0.1 $\mu$m technology," *Int'l Electron Devices Meeting Technical Digest*, IEDM 95, pp. 897–900, 1995.

* cited by examiner

*Primary Examiner*—Vu A. Le
*Assistant Examiner*—Adam Pyonin
(74) *Attorney, Agent, or Firm*—Williams, Morgan & Amerson, P.C.

(57) ABSTRACT

A method for forming a retrograde impurity profile in a semiconducting substrate is provided. The method comprises forming a sacrificial layer having a thickness in the range of about 10 Å to about 150 Å on the surface of a semiconducting substrate. Thereafter, an ion implantation process is performed wherein dopant impurity ions are directed through the sacrificial layer and into the semiconducting substrate under conditions effective to form a retrograde impurity profile in the semiconducting substrate.

27 Claims, 4 Drawing Sheets

METHOD FOR FORMING A RETROGRADE IMPURITY PROFILE

BACKGROUND OF THE INVENTION

1. Field of the Invention

This invention relates generally to the fabrication of semiconductor devices, and, more particularly, to a method for forming a retrograde impurity profile in a semiconducting material.

2. Description of the Related Art

Ion implantation processes are widely used in the fabrication of very large scale integration (VLSI) and ultra large scale integration (ULSI) integrated circuit devices to introduce a desired quantity of dopant atoms into a target substrate material. For example, ion implantation is a commonly used process for introducing impurities, e.g., dopant materials, into the surface of a semiconducting substrate in order to modulate the conductive properties of the semiconducting substrate.

It is generally desired that a dopant material be implanted to some depth within a semiconducting substrate that is being prepared for device fabrication rather than having the dopant concentrated at or near only the surface of the semiconducting substrate. In one approach for introducing dopant impurities into a semiconducting substrate, a suitable dopant is introduced into the surface of the substrate and diffused to a desired depth by heating the substrate. Under such conditions, the diffusion of the dopant material occurs laterally as well as vertically, resulting in lateral spreading of the dopant within the substrate. Such lateral spreading of the dopant material has the undesired effect of reducing the packing density of the implanted material in the semiconducting substrate, which can adversely influence the properties of semiconducting devices subsequently fabricated on the surface of the substrate. Moreover, as illustrated in diffused impurity profile 6 of FIG. 1, although dopant can be diffused to some depth within the semiconducting substate, the dopant concentration is invariably highest at the surface of the substrate and decreases with increasing depth.

For many applications, it is desired that the peak concentration of the dopant material occurs at some depth under the surface of the substrate rather than at the substrate surface. This is generally referred to as a retrograde impurity profile. Retrograde impurity profiles may be formed using high-energy ion implantation processes, which allow for improved impurity depth control and reduced spreading compared with diffusion techniques. In an illustrative retrograde impurity profile 8, as represented in FIG. 1, the concentration Y of the implanted dopant material at depth X is higher than the concentration Z observed at depth X for diffused impurity profile 6. Thus, in contrast to diffused impurity profile 6, the concentration of the dopant material for a retrograde impurity profile 8 is highest at some depth within the substrate, rather than at the surface, and decreases as it approaches the substrate surface. Retrograde impurity profiles in a semiconducting substrate are particularly useful in integrated circuit manufacturing, for example, to form n-well and p-well regions in complementary metal oxide semiconductor (CMOS) transistors and to produce buried collector regions in bipolar transistors. Some of the advantages provided by retrograde impurity profiles in the manufacture of CMOS and other devices include reduced susceptibility to vertical punchthrough and improved protection from latchup.

In prior art methods for forming retrograde impurity profiles, dopant ions are commonly directed at a layer of material overlying the surface of the semiconducting substrate rather than being implanted directly into the substrate. As a result, the ions contact and penetrate this surface layer before they penetrate the semiconducting substrate. The surface layer may serve as a protective screen against contamination by metals or other impurities during the implant. Moreover, the layer may also be important in reducing the extent of ion channeling in the substrate by randomizing the direction of the ions as they enter the substrate lattice. This surface layer typically is referred to as a "sacrificial" layer because it is generally removed at some point after the implantation process.

The thickness of sacrificial surface layers used in prior processes for forming retrograde impurity profiles in semiconducting substrates has been generally greater than 200 Å. However, sacrificial layers having thicknesses greater than 200 Å may be associated with less than desirable dopant depth control and spreading, which can adversely effect the performance of transistors fabricated thereafter above the surface of the semiconducting substrate.

The present invention is directed to overcoming, or at least reducing the effects of, one or more of the problems set forth above.

SUMMARY OF THE INVENTION

In one aspect of the present invention, a method is provided for forming a retrograde impurity profile in a semiconducting substrate. The method involves first forming a sacrificial layer comprising an oxide, nitride, or other like material, on the surface of a semiconducting substrate. The sacrificial layer has a thickness in the range of about 10 Å to about 150 Å, and may be formed by any of a variety of techniques, including thermal oxidation, deposition, and the like. Thereafter, an ion implantation process is performed in which dopant impurity ions, such as arsenic, indium, gallium, antimony, or other like ions, are directed at the surface of the sacrificial layer. The impurity ions will typically be directed at the sacrificial layer using an implantation energy in the range of about 50 Kev to about 200 Kev, and having a dose in the range of about $1 \times 10^{12}$ ions/cm$^2$ to about $5 \times 10^{13}$ ions/cm$^2$. By practice of this invention, a steep retrograde impurity profile is formed in the semiconducting substrate. Integrated circuit devices fabricated on the surface of the semiconducting substrate will have improved performance characteristics as a result of the steep retrograde impurity profile formed therein.

BRIEF DESCRIPTION OF THE DRAWINGS

The invention may be best understood by reference to the following description taken in conjunction with the accompanying drawings, in which like reference numerals identify like elements, and in which.

Figure 1:
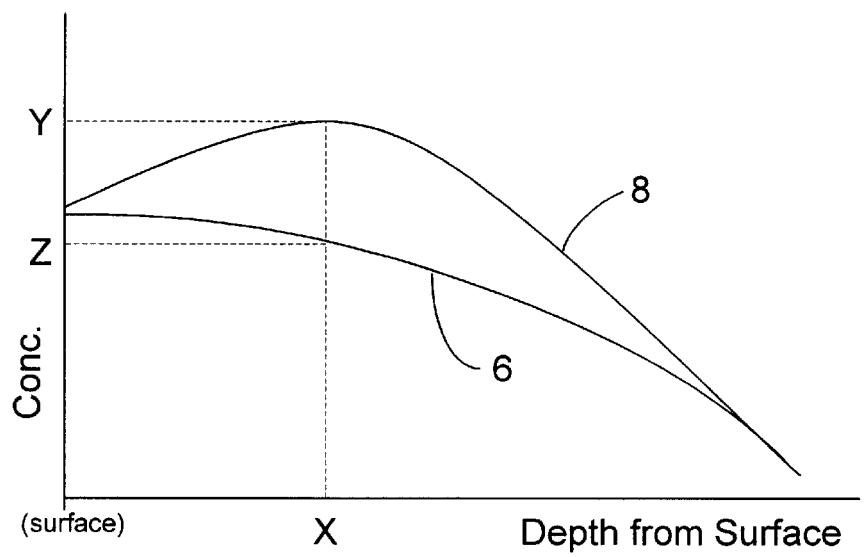
FIG. 1 is a graph illustrating the relationship between dopant concentration and substrate depth for a diffused impurity profile and a retrograde impurity profile within a semiconducting substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–7. It should be noted, however, that the drawings are in a greatly simplified form, and are not intended to be inclusive of each and every step employed during the fabrication process. Moreover, although the various regions and structures of a semiconductor device are depicted in the drawings as having very precise, sharp configurations and profiles, those skilled in the art recognize that these regions and structures may not be as precise as indicated in the drawings. Additionally, the relative sizes of the various features depicted in the drawings may be exaggerated and/or reduced as compared to the size of those feature sizes on fabricated devices. Nevertheless, the attached drawings are included to describe and explain illustrative examples of the present invention.

Figure 2:
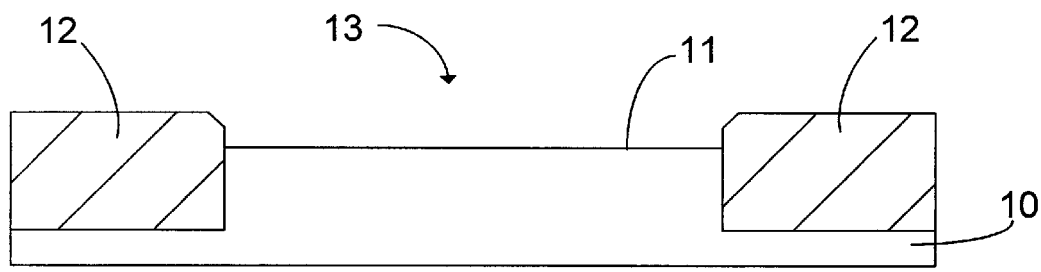
FIG. 2 is a partial cross-sectional view of an active area of a semiconducting substrate.

Turning first to FIG. 2, a semiconducting substrate 10 having a surface 11 is provided within an active area 13 defined by a plurality of regions comprised of a dielectric material 12. The semiconducting substrate 10 may be selected from any one of a variety of suitable semiconducting materials, including silicon, germanium, gallium arsenide, gallium arsenide phosphide, and other like materials. In one illustrative embodiment of the invention, the semiconducting substrate 10 is comprised of monocrystalline silicon. The dielectric material 12 may be comprised of essentially any suitable dielectric material, e.g., silicon dioxide, silicon nitride, silicon oxynitride, etc. Depending on the particular application for which the method of this invention is employed, the dielectric material 12 may function, for example, as a field dielectric, e.g., field oxide, use to electrically isolate a plurality of active areas on the surface of a semiconducting substrate. Alternatively, the dielectric material 12 may function to electrically isolate one device structure from another device structure within an active area of a semiconducting substrate. In the latter case, for example, the dielectric material 12 may function as a trench dielectric, e.g., trench oxide, used to isolate transistor structures within a CMOS device.

Figure 3:
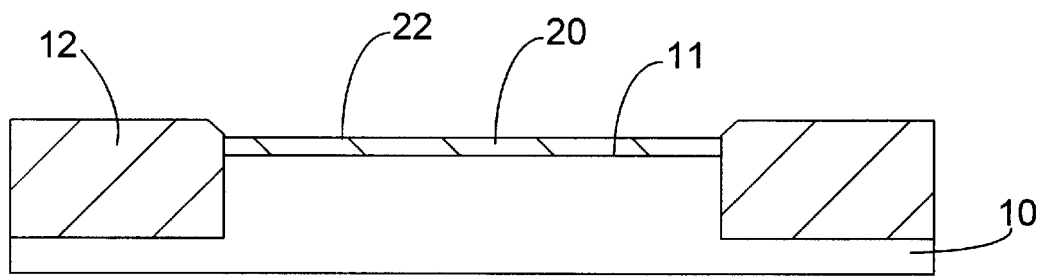
FIG. 3 represents a process step subsequent to that depicted in FIG. 2 in which a thin sacrificial layer is formed on the surface of the semiconducting substrate.

With reference to FIG. 3, a sacrificial layer 20 is formed on the surface 11 of the semiconducting substrate 10. The sacrificial layer 20 has a thickness in the range of about 10 Å to about 150 Å in order to allow the desired retrograde impurity profile to be formed in the semiconducting substrate 10. The sacrificial layer 20 may be comprised of any one of a variety of dielectric materials, such as silicon dioxide, silicon nitride, silicon oxynitride, or other like materials effective for use in forming a retrograde impurity profile. The sacrificial layer 20 may be formed by a number of techniques available in the art. For example, the sacrificial layer 20 may be thermally formed, or it may be formed by a suitable deposition process, such as low pressure chemical vapor deposition, plasma enhanced chemical vapor deposition, and other like techniques.

In one illustrative embodiment of the invention, the sacrificial layer 20 is comprised of a silicon dioxide layer formed by a thermal oxidation process. The conditions under which the thermal oxidation process is performed are not critical provided the layer is formed with the desired thickness. Typically, the thermal oxidation is performed by exposing the surface 11 of the semiconducting substrate 10 to a temperature in the range of about 800° C. to about 1000° C. for duration of about 0.1 to about 1 hour. The thermal oxidation is generally performed in an oxygen or other suitable environment at a pressure in the range of about 0.5 to about 1.5 atmospheres.

Figure 4:
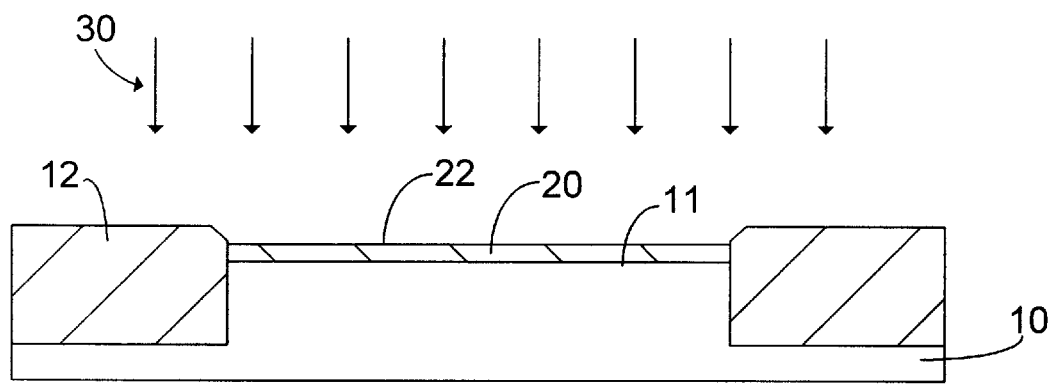
FIG. 4 represents a process step subsequent to that depicted in FIG. 3 in which dopant ions are directed at the sacrificial layer on the surface of the semiconducting substrate.

With reference to FIG. 4, an ion implantation process is performed in which dopant impurity ions 30 are directed at the surface 22 of the sacrificial layer 20 under conditions effective for forming a retrograde impurity profile in the semiconducting substrate 10. Essentially any suitable dopant material may be used in the ion implantation process. For example, the dopant material may be selected from arsenic, antimony, indium, gallium, phosphorus, boron, and other like materials. In one illustrative embodiment of the invention, the dopant material is arsenic.

The implant energy employed in the ion implantation process may vary depending on the particular dopant species used and on the thickness and composition of the sacrificial layer 20. For most applications, ion implant energies will be in the range of about 50 Kev to about 200 Kev, more typically between about 50 Kev and about 150 Kev. In one illustrative embodiment of the invention, the implant energy is in the range of about 75 Kev to about 100 Kev.

The implant dose employed in the ion implantation process is not specifically restricted, and may be selected to meet the requirements of a given application. Typically, the implantation dose will be in the range of about $1 \times 10^{12}$ ions/cm$^2$ to about $5 \times 10^{13}$ ions/cm$^2$, more typically in the range of about $4 \times 10^{12}$ ions/cm$^2$ to about $8 \times 10^{12}$ ions/cm$^2$.

In one illustrative embodiment of this invention, a retrograde arsenic profile is provided in a semiconducting substrate 10 by directing arsenic ions having an implant energy in the range of about 75 to about 100 Kev at a sacrificial silicon dioxide layer 20 having a thickness in the range of about 25 Å to about 100 Å. The arsenic ions in this embodiment will generally be delivered at a dose in the range of about $4 \times 10^{12}$ ions/cm$^2$ to about $8 \times 10^{12}$ ions/cm$^2$.

Figure 5:
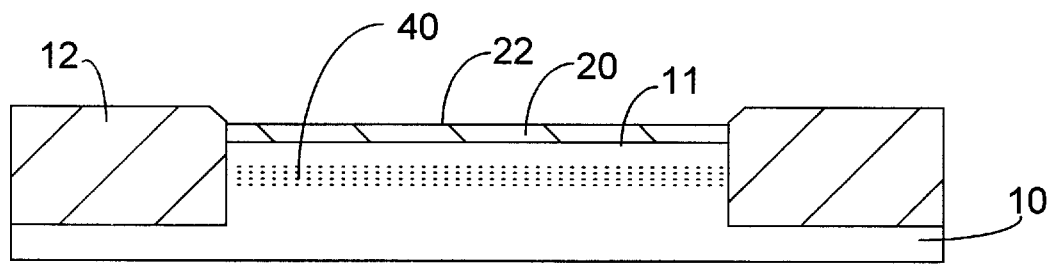
FIG. 5 depicts a retrograde impurity profile formed within the semiconducting substrate as a result of the process steps described in FIGS. 2–4.

With reference to FIG. 5, a retrograde impurity profile 40 is formed in the semiconducting substrate 10 by practice of the process described above. The sacrifical layer 20 may be subsequently removed using any one of a variety of approaches, e.g., hydroflouric acid (HF) etching, plasma etching, or another similar technique available in the art. The process steps performed subsequent to the formation of the retrograde impurity profile 40 and the removal of the sacrifical layer 20 will vary depending on the types of integrated circuit devices being fabricated. Typically, a plurality of transistor devices, e.g., field effect transistors, bipolar junction transistors, or the like, are formed on the surface 11 of the semiconducting substrate 10 using conventional fabrication techniques.

Figure 6:
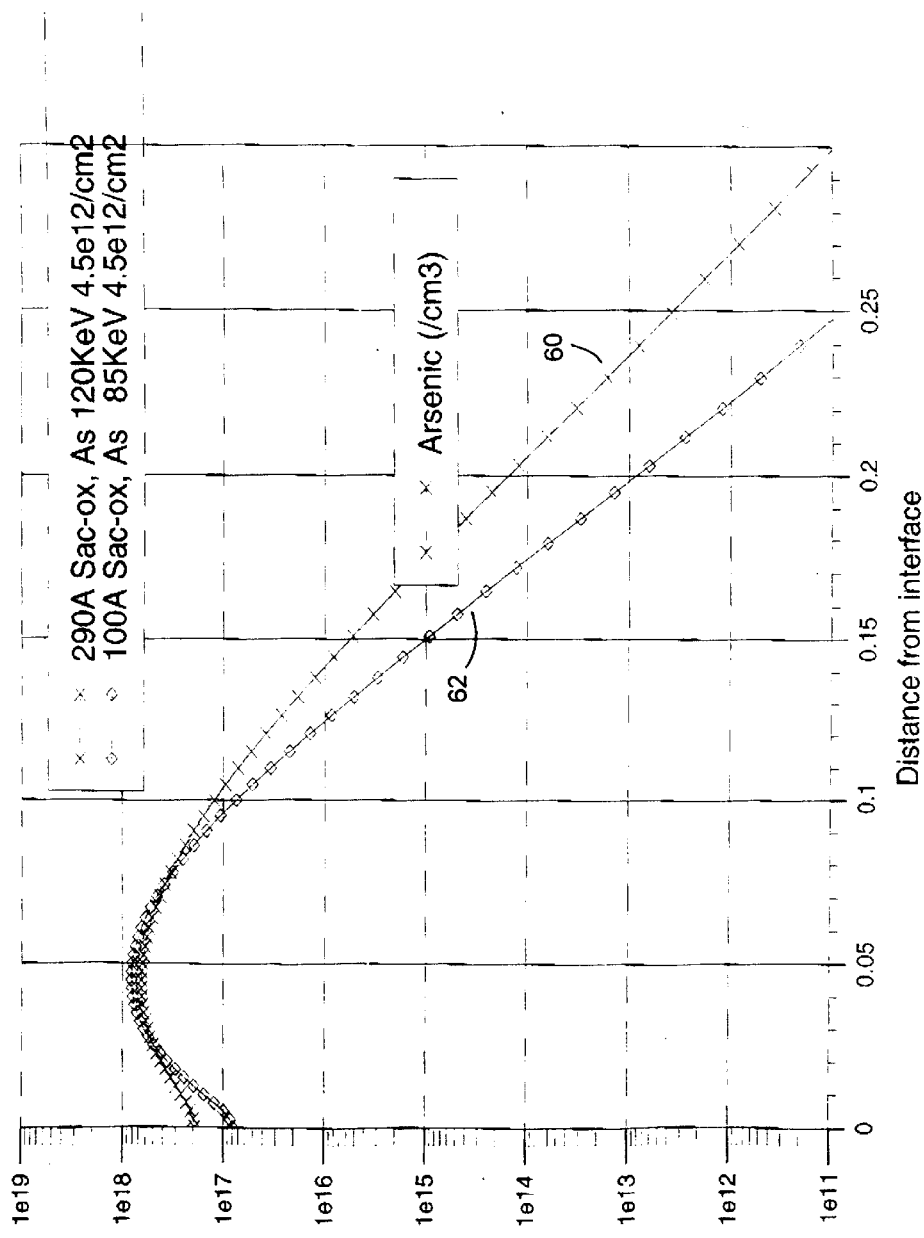
FIG. 6 represents a graph illustrating the improved retrograde impurity profile provided by this invention.
Figure 7:
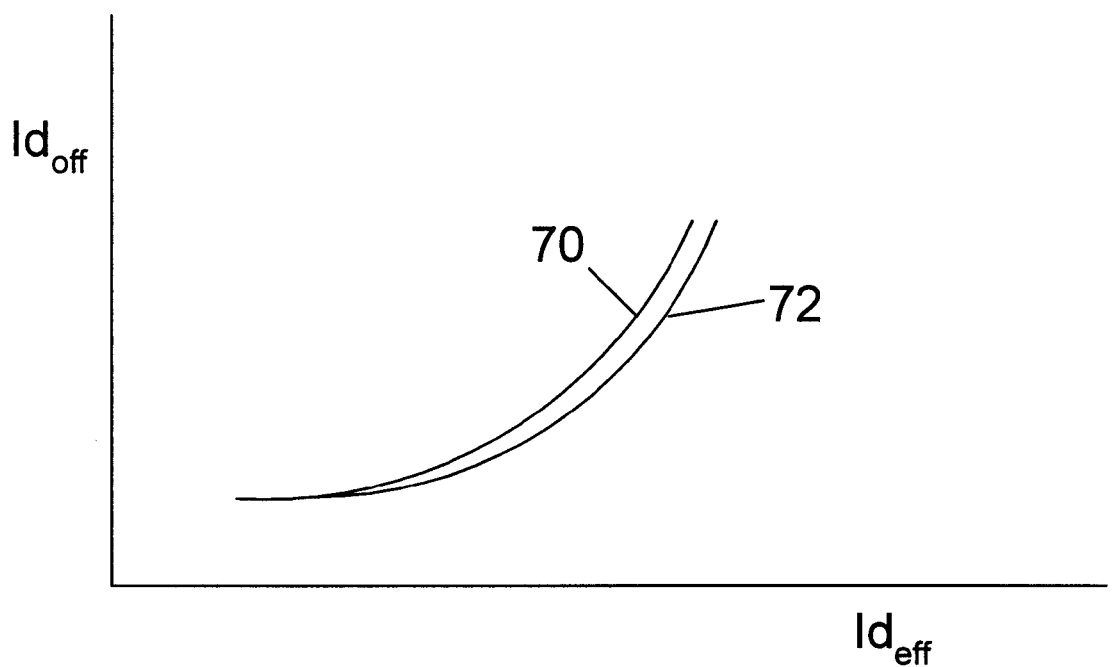
FIG. 7 represents a graph illustrating an improvement in transistor performance provided by this invention.

As illustrated in FIG. 6, the retrograde impurity profile 62 provided by this invention offers improved dopant depth control relative to retrograde impurity profile 60 formed by a prior art process. The retrograde impurity profile provided by this invention is particularly attractive for the manufacture of silicon integrated circuits wherein it is desired to have a higher and more controlled concentration of dopants at some depth into the substrate. Such applications may include threshold voltage adjust implantations for a variety of field effect transistor types, formation of buried collectors in bipolar transistors, and the like. In one example, a retrograde impurity profile formed in a semiconducting substrate according to the present invention improves transistor device performance of devices fabricated above the semiconducting substrate by resulting in less leakage current for a given transistor drive current. For example, as illustrated in FIG. 7, a transistor fabricated above the surface of the semiconducting substrate 10 having a retrograde impurity profile 40 exhibits an improved $Id_{off}:Id_{eff}$ ratio 72 compared with the $Id_{off}:Id_{eff}$ ratio 70 of a retrograde impurity profile produced by a prior process.

The specific materials, energies, dosages, and other process parameters set forth herein to describe and exemplify illustrative embodiments of the invention are not intended to be limiting. Indeed, the particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for forming a retrograde impurity profile in a semiconducting substrate comprising:

forming a sacrificial layer having a thickness in the range of about 10 Å to about 150 Å on the surface of a semiconducting substrate;

prior to forming a gate insulation layer or a gate electrode structure, directing impurity ions having an implant energy in the range of about 50 Kev to about 200 Kev and a dose in the range of about $1\times10^{12}$ ions/cm$^2$ to about $5\times10^{13}$ ions/cm$^2$ at the surface of said sacrificial layer to form a retrograde impurity profile in said semiconducting substrate; and removing said sacrificial layer from the surface of the semiconducting substrate.

2. The method of claim 1, wherein said sacrificial layer has a thickness in the range of about 25 Å to about 100 Å.

3. The method of claim 1, wherein said sacrificial layer has a thickness in the range of about 50 Å to about 75 Å.

4. The method of claim 1, wherein said sacrificial layer is comprised of silicon dioxide, silicon nitride or silicon oxynitride.

5. The method of claim 1, wherein said sacrificial layer is comprised of silicon dioxide and it is formed by a thermal process or a deposition process.

6. The method of claim 1, wherein directing impurity ions at the surface of said sacrificial layer comprises directing impurity ions having an implant energy in the range of about 50 Kev to about 150 Kev at the surface of said sacrificial layer.

7. The method of claim 1, wherein directing impurity ions at the surface of said sacrificial layer comprises directing arsenic, antimony, indium, phosphorus, boron or gallium at the surface of said sacrificial layer.

8. The method of claim 1, wherein directing impurity ions at the surface of said sacrificial layer comprises directing antimony ions at a concentration level ranging from approximately $4-8\times10^{12}$ ions/cm$^2$ at an implant energy in the range of about 50 Kev to about 150 Kev at the surface of said sacrificial layer.

9. The method of claim 1, wherein directing impurity ions at the surface of said sacrificial layer comprises directing arsenic ions at a concentration level ranging from approximately $4-8\times10^{12}$ ions/cm$^2$ at an implant energy in the range of about 75 Kev to about 100 Kev at the surface of said sacrificial layer.

10. The method of claim 1, wherein directing impurity ions at the surface of said sacrificial layer comprises directing impurity ions having a dose in the range of about $4\times10^{12}$ ions/cm$^2$ to about $8\times10^{12}$ ions/cm$^2$ at the surface of said sacrificial layer.

11. A method for forming a retrograde impurity profile in a silicon substrate comprising:

forming a sacrificial silicon dioxide layer having a thickness in the range of about 10 Å to about 150 Å on the surface of a silicon substrate;

prior to forming a gate insulation layer or a gate electrode structure, directing impurity ions having an implant energy in the range of about 50 Kev to about 200 Kev and a dose in the range of about $1\times10^{12}$ ions/cm$^2$ to about $5\times10^{13}$ ions/cm$^2$ at the surface of said sacrificial silicon dioxide layer to form a retrograde impurity profile in said silicon substrate; and removing said sacrificial silicon dioxide layer from the surface of the silicon substrate.

12. The method of claim 11, wherein said sacrificial silicon dioxide layer has a thickness in the range of about 25 Å to about 100 Å.

13. The method of claim 11, wherein said sacrificial silicon dioxide layer has a thickness in the range of about 50 Å to about 75 Å.

14. The method of claim 11, wherein said sacrificial silicon dioxide layer is formed by a thermal process or a deposition process.

15. The method of claim 11, wherein directing impurity ions at the surface of said sacrificial silicon dioxide layer comprises directing impurity ions having an implant energy in the range of about 50 Kev to about 150 Kev at the surface of said sacrificial silicon dioxide layer.

16. The method of claim 11, wherein directing impurity ions at the surface of said sacrificial silicon dioxide layer comprises directing arsenic, antimony, indium, or gallium at the surface of said sacrificial silicon dioxide layer.

17. The method of claim 11, wherein directing impurity ions at the surface of said sacrificial silicon dioxide layer comprises directing antimony ions at a concentration level ranging from approximately $4-8\times10$ ions/cm$^2$ at an implant energy in the range of about 50 Kev to about 150 Kev at the surface of said sacrificial silicon dioxide layer.

18. The method of claim 11, wherein directing impurity ions at the surface of said sacrificial silicon dioxide layer comprises directing arsenic ions at a concentration level ranging from approximately 4–8×10 ions/cm$^2$ at an implant energy in the range of about 75 Kev to about 100 Kev at the surface of said sacrificial silicon dioxide layer.

19. The method of claim 11, wherein directing impurity ions at the surface of said sacrificial silicon dioxide layer comprises directing impurity ions having a dose in the range of about 4×10$^{12}$ ions/cm$^2$ to about 8×10$^{12}$ ions/cm$^2$ at the surface of said sacrificial silicon dioxide layer.

20. A method for forming a retrograde impurity profile in a silicon substrate comprising:

forming a sacrificial silicon dioxide layer having a thickness in the range of about 10 Å to about 150 on the surface of a silicon substrate;

prior to forming a gate insulation layer or a gate electrode structure, directing arsenic ions having an implant energy in the range of about 50 Kev to about 200 Kev and a dose in the range of about 1×10$^{12}$ ions/cm$^2$ to about 5×10$^{13}$ ions/cm$^2$ at the surface of said sacrificial silicon dioxide layer to form a retrograde impurity profile in said silicon substrate; and removing said sacrificial silicon dioxide layer from the surface of the silicon substrate.

21. The method of claim 20, wherein said sacrificial silicon dioxide layer has a thickness in the range of about 25 Å to about 100 Å.

22. The method of claim 20, wherein said sacrificial silicon dioxide layer has a thickness in the range of about 50 Å to about 75 Å.

23. The method of claim 20, wherein said sacrificial silicon dioxide layer is formed by a thermal process or a deposition process.

24. The method of claim 20, wherein said sacrificial silicon dioxide layer is formed by heating the silicon substrate to a temperature in the range of about 800° C. to about 1000° C. for a duration of about 0.1 hour to about 1 hour.

25. The method of claim 20, wherein directing arsenic ions at the surface of said sacrificial silicon dioxide layer comprises directing arsenic ions having an implant energy in the range of about 50 Kev to about 150 Kev at the surface of said sacrificial silicon dioxide layer.

26. The method of claim 20, wherein directing arsenic ions at the surface of said sacrificial silicon dioxide layer comprises directing arsenic ions having an implant energy in the range of about 75 Kev to about 100 Kev at the surface of said sacrificial silicon dioxide layer.

27. The method of claim 20, wherein directing arsenic ions at the surface of said sacrificial silicon dioxide layer comprises directing arsenic ions having a dose in the range of about 4×10$^{12}$ ions/cm to about 8×10$^{12}$ ions/cm at the surface of said sacrificial silicon dioxide layer.

* * * * *